United States Patent [19]

Howell et al.

[11] Patent Number: 5,747,115
[45] Date of Patent: May 5, 1998

[54] UV-CURABLE AND NON-VOLATILE PIGMENTED COATINGS

[75] Inventors: Barbara F. Howell, Arnold; Karen M. Poole, Annapolis, both of Md.

[73] Assignee: The United States of America as represented by the Secretary of the Navy, Washington, D.C.

[21] Appl. No.: 397,014

[22] Filed: Feb. 28, 1995

Related U.S. Application Data

[63] Continuation of Ser. No. 128,406, Sep. 30, 1993, abandoned.

[51] Int. Cl.⁶ .................................................. B05D 3/06
[52] U.S. Cl. ...................... 427/514; 427/512; 427/518; 427/519

[56] References Cited

U.S. PATENT DOCUMENTS

| | | | |
|---|---|---|---|
| 3,661,614 | 5/1972 | Bassemir et al. | 117/38 |
| 3,998,979 | 12/1976 | Armstrong et al. | 427/54 |
| 4,042,476 | 8/1977 | Collins et al. | 204/159.15 |
| 4,054,683 | 10/1977 | Gruber | 427/53 |
| 4,077,859 | 3/1978 | Costanza et al. | 204/159.23 |
| 4,287,228 | 9/1981 | Schlesinger | 427/54.1 |
| 4,425,209 | 1/1984 | Saeki et al. | 204/159.23 |
| 4,649,062 | 3/1987 | Kosiorek et al. | 427/54.1 |
| 4,753,817 | 6/1988 | Meixner et al. | 427/54.1 |
| 4,956,221 | 9/1990 | Gutek | 427/54.1 |

*Primary Examiner*—Shrive Beck
*Assistant Examiner*—Erma Cameron
*Attorney, Agent, or Firm*—Charles D. Miller

[57] ABSTRACT

A method is described for forming a pigmented coating on a poorly prepared, cold metal surface that cures in less than one minute by exposure to ultraviolet radiation from a xenon lamp and emits extremely low levels of volatile organic compounds so that application can be done safely in a confined space.

15 Claims, 2 Drawing Sheets

UV-CURABLE AND NON-VOLATILE PIGMENTED COATINGS

This application is a continuation of application Ser. No. 08/128,406, filed Sep. 30, 1993, now abandoned.

BACKGROUND OF THE INVENTION

1. Field of the Invention

This invention relates to pigmented coatings and particularly relates to pigmented organic coatings that have very low volatility and are curable at specific wavelengths of ultraviolet light.

2. Review of the Prior Art

Older methods used to recoat metal surfaces have required careful surface cleaning and one or more hours for drying. Furthermore, a significant amount of volatile organic compounds were emitted during the drying process.

For Naval vessel maintenance, it has been necessary to apply the coating when the ship was in port, thereby greatly adding to the cost.

If an object was to be coated by ultraviolet light (uv) curing, it was formerly placed on a conveyer belt during the curing step. UV light was customarily supplied with a medium pressure mercury lamp. Unfortunately, however, titanium dioxide absorbs or scatters radiation at shorter wavelengths than about 390 nm where mercury emits radiation strongly, as shown in FIG. 1.

Until the last year or so, there have been no commercially available, pigmented, uv-curable coatings. No commercial materials have been developed for curing with a xenon lamp. This is an important factor for Navy use in confined spaces because no mercury is allowed therein, thereby prohibiting general use of lamps for uv curing since all contain mercury.

A pigmented coating which is to be uv cured contains a photosensitizer, a pigment, a reaction initiator, and the resin binder system. Most of these coatings cure by a free radical mechanism which is suitable for resins containing acrylic groups but which can also be suitable for resins containing polyesters, epoxies, polyurethanes, and the like, if these also have acrylic groups. Some systems contain thermal curing agents, e.g., peroxides, as well.

Work has been done on production of uv-cured, pigmented coatings which were cured with a D bulb (Fusion UV Curing Systems, Rockville, Md. 20855). A plot of the spectral output of this bulb is shown in FIG. 2. This type of bulb contains mercury and therefore cannot be used by the Navy in confined spaces.

Much work is being done in this field but there is an unsolved need for a resinous composition that is pigmented, solvent-free, quickly curable with ultraviolet light, and tightly adherent to metal surfaces when cured. There is a further need for a method of curing such a composition in confined spaces. There is an additional need for a means and method of providing ultraviolet light, having a spectral output at wavelengths suitable for titanium dioxide, that is produced without using mercury.

SUMMARY OF THE INVENTION

It is an object of this invention to provide a method of curing a pigmented organic coating with ultraviolet light provided by a xenon lamp.

It is another object to provide a coating formulation that contains pigments and cross-linkable organic compounds and is suitable for curing with ultraviolet light from a xenon lamp within approximately one minute.

It is a further object to provide a pigmented organic composition that cures with ultraviolet light from a xenon lamp and has a very low volatile organic content so that curing can be done safely in a confined space.

It is an additional object to provide a composition that can be applied to a poorly prepared metal surface, which may be but need not be considerably colder than room temperature, and can then be cured with ultraviolet light from a xenon lamp to dryness in one minute or less.

It is a still further object to provide a method of curing a pigmented organic coating with ultraviolet light from a hand held xenon lamp so that the coating can be cured in situ in virtually any location.

It has surprisingly been discovered that a composition comprising a photosensitizer, a photoinitiator, and a resin containing a reactive acrylic group can be spread on a partially rusted steel panel and then cured in less than one minute with ultraviolet light from a xenon lamp to form a dry, cured coating. It has further been discovered that this compound must be no thicker than 2.4 mils if the compound contains rutile titanium dioxide. It has additionally been discovered that the xenon lamp can suitably be a hand held lamp which can be positioned to cure a coating in situ in virtually any location.

Such a lamp is a RC-500 Xenon lamp obtained from Xenon Corp., Woburn, Mass. 10801 which covers an area of 3 inches by 3 inches at one time when held so that the coating is about ¼ inch from the outside of the lamp housing.

There are many advantages to uv curing the coatings of this invention with xenon lamps, particularly for Naval applications, as follows: (1) No solvent is given off during hardening of the coating. This results in extremely low emission of volatile organic compounds (VOC) and meets EPA requirements. Moreover, minimal VOC emission makes the technique useful for coating applications in confined spaces. (2) Uv coatings cure in a very short time, such as a minute or less. (3) Uv coatings can be applied with a brush to cold surfaces or to tight rust surfaces. (4) No mixing of two components is required, and there is no waiting time following mixing, as is the case for epoxies. In contrast, the uv curing mixture is ready to apply. (5) For Naval submarine applications, xenon lamps are suitable, whereas mercury lamps are unsuitable because no mercury is allowed. (6) Xenon lamps emit high levels of radiation in the near uv region (~390 nm), activating a photosensitizer, such as isopropyl thioxanthone which absorbs strongly at 386 nm. When activated, the photosensitizer transmits energy to the photoinitiator. (7) At 386 nm, about half of the incident radiation is transmitted by the titanium dioxide in the coating, whereas at shorter wavelengths, where mercury emits radiation strongly, almost all the radiation is absorbed or scattered by this pigment. In consequence, the xenon lamp is more effective for curing uv coatings than is a mercury lamp.

The pigmented coating to be applied to a panel, such as a steel panel, may contain any of a variety of uv curable materials having a reactive acrylate group which include an acrylate oligomer, an aromatic urethane diacrylate, an aliphatic urethane diacrylate, polyester tetra-acrylate, and an epoxy acrylate, such as bisphenol-A epoxy diacrylate. Optimum results have been obtained with an epoxy acrylate, but such compounds are much too high in viscosity for use as spreadable coatings. In consequence, reactive diluents which are also photopolymerizable are preferably admixed with the epoxy acrylate. Such diluents include isobornyl acrylate and trimethylol propane triacrylate. The latter compound additionally reacts with three functional groups and increases crosslinking which can be beneficial.

The photoinitiator is selected from the group consisting of 2-hydroxy-2-methyl-1-phenyl-1-propanone and diphenyl (2,4,6-trimethylbenzoyl) phosphine oxide (1:1), 2-methyl-1-[4(methylthio)phenyl]-2-(4-morpholinyl)-1-propanone, 2-benzyl-2-(dimethylamino)-1-[4-(4-morpholinyl)phenyl]-1-butanone, and N-cyclopropyl-N'-(1,1 -dimethylethyl-6-(methylthio)-1,3,5-triazine-2,4-diamine.

The photosensitizer is selected from the group consisting of isopropyl thioxanthone, chlorothioxanthone, thioxanthone, benzanthrone, 1,3-diphenyl-2-propanone, triphenyl acetophenone, fluorenone, biphenyl, flavone, 4-acetyl biphenyl, diacetyl, fluorene, 9,10-phenanthrenequinone, benzophenone, and benzil.

To produce a gray color, the pigments are preferably titanium dioxide and manganese ferrite, 95% rutile titanium dioxide and 5% manganese ferrite being especially preferred. Other colors require other pigment combinations or in some instances a single pigment, but it should be understood that the term, pigments, includes a single pigment.

Coatings may contain as much as 10% pigment, but they must not be thicker than approximately 2.4 mils if thorough curing is to be obtained when they contain titanium dioxide. Coatings containing solvents are not satisfactory if they are to be used in confined spaces. Additionally, if a solvent were present, bubbles would be created in the coatings by the evaporating solvent.

Resins containing reactive functional groups other than acrylic have been found to be also photocurable with a xenon lamp, but they are either expensive or do not produce coatings of comparable quality and particularly tend not to adhere tightly to a metal surface.

Spectra of mercury and xenon are shown in FIG. 3. Some xenon lamps, e.g., the Xenon Corp. RC-500, are portable; this feature allows coatings to be cured in situ in virtually any location, rather than requiring that the coated object pass through a curing tunnel on a conveyor belt. Use of such a portable xenon lamp for curing uv coatings provides a method that is therefore well adapted for doing touch up when a ship or submarine is underway.

DESCRIPTION OF THE PREFERRED EMBODIMENTS

Figure 1:
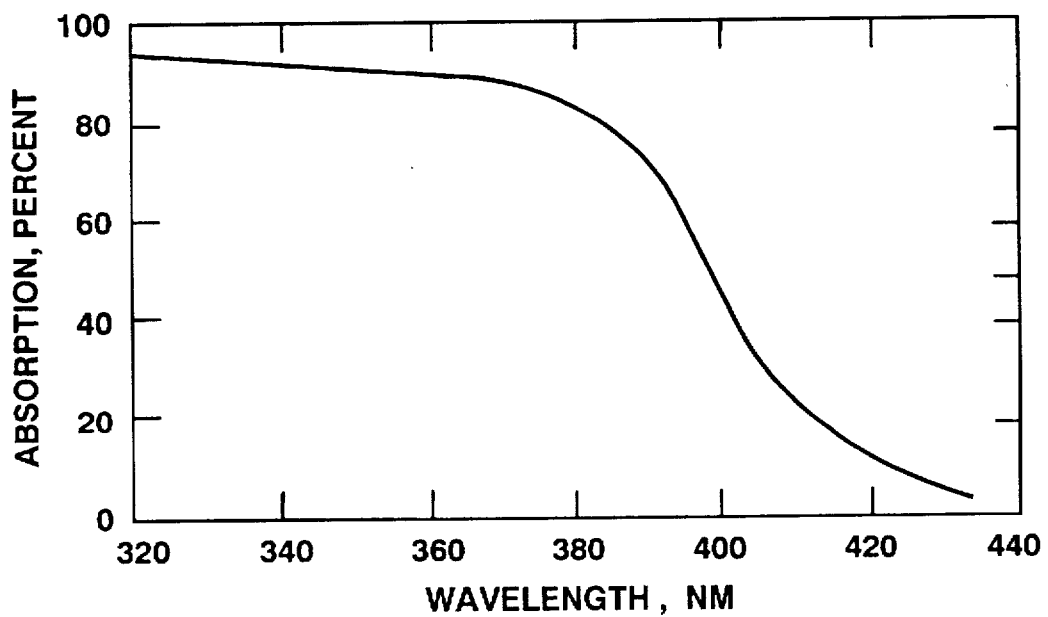
FIG. 1 is the ultraviolet absorption spectrum of $TiO_2$ from 320 to 440 nm.
Figure 2:
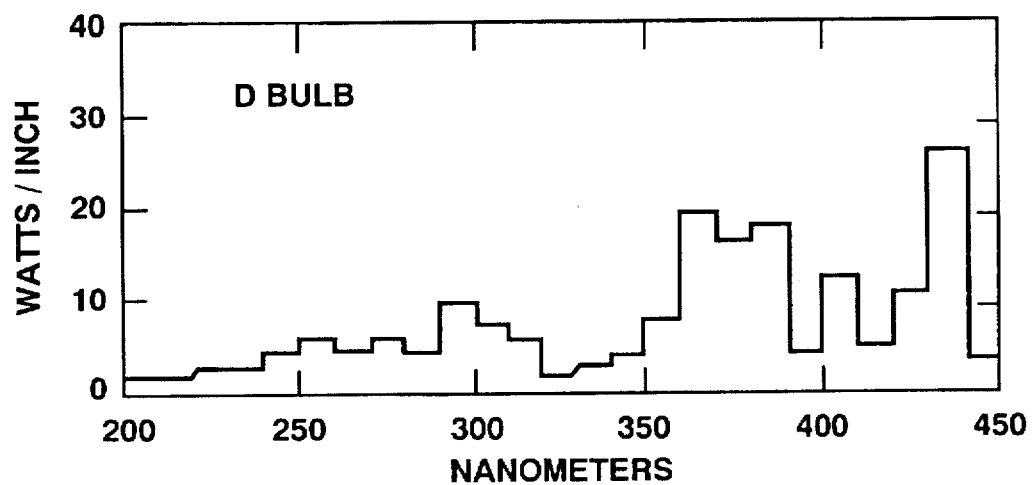
FIG. 2 is the lamp output of a D lamp which contains mercury.
Figure 3:
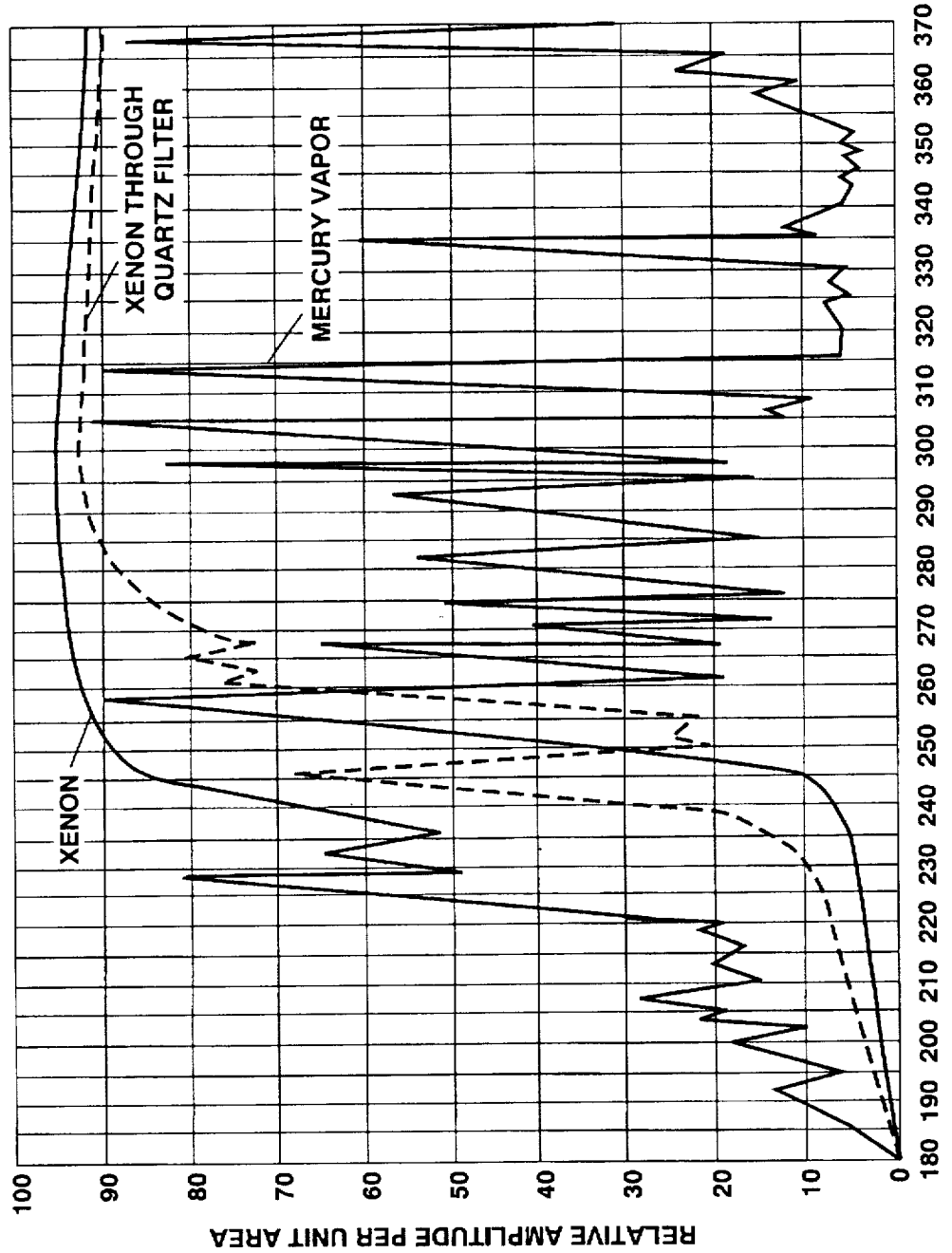
FIG. 3 is a comparison of the spectral output of a xenon lamp, both filtered and unfiltered, with that of a mercury lamp.

The following examples illustrate the practice of the invention, using the following materials:
Resins An acrylate oligomer, such as Ebecryl® 745 from Radcure Specialties, Inc.; an aliphatic urethane diacrylate, such as Ebecryl® 284 from Radcure Specialties, Inc.; an aromatic urethane diacrylate, such as Ebecryl® 4827 from Radcure Specialties, Inc.; polyester tetra-acrylate, such as Ebecryl® 810 from Radcure Specialties, Inc.; and bisphenol-A epoxy diacrylate (CAS #055818-57-0), such as Ebecryl® 3700 from Radcure Specialties, Inc.

Photoinitiators 2-hydroxy-2-methyl-1-phenyl-1-propanone, such as Darocur® 4265 from Ciba Geigy, and diphenyl (2,4,6-trimethylbenzoyl) phosphine oxide (1:1); 2-methyl-1-[4 (methylthio)phenyl]-2-(4-morpholinyl)-1-propanone, such as Irgacure® 907 from Ciba Geigy; 2-benzyl-2-(dimethylamino)-1-[4-(4-morpholinyl)phenyl]-1-butanone, such as Irgacure® 369 from Ciba Geigy; and N-cyclopropyl-N'-(1,1-dimethylethyl-6-(methylthio)-1,3,5-triazine-2,4-diamine, such as Irgarol® 1051 from Ciba Geigy.
Photosensitizers ITX, isopropyl thioxanthone obtained from Aceto Corporation, Lake Success, N.Y. 11042-1215, chlorothioxanthone, thioxanthone, benzanthrone, 1,3-diphenyl-2-propanone, triphenyl acetophenone, fluorenone, biphenyl, flavone, 4-acetyl biphenyl, diacetyl, fluorene, 9,10-phenanthrenequinone, benzophenone, and benzil.
Miscellaneous Components TMPTA, trimethylol propane triacrylate, and IBOA, isobornyl acrylate, obtained from Radcure Specialties, Inc.
Pigments Titanium dioxide, such as TiONA® $TiO_2$ from SCM Chemicals, as lot 25-JKSJ, Baltimore, Md. 21202

Manganese ferrite, obtained from Ferro Corp., Cleveland, Ohio 44101
Equipment

Curing was done with an RC-500 xenon lamp obtained from Xenon Corp., Woburn, Mass. 01801
Formulations Pigments were added so as to be 10% or less by weight of the coating mixture. The pigments consisted of 95% rutile titanium dioxide and 5% manganese ferrite. The dry pigments were thoroughly mixed on a paint shaker, then combined with the resin mixture to form a spreadable composition. Coatings were applied to metal panels which had been grit blasted and subsequently washed with a 50/50 mixture of methyl ethyl ketone (MEK) and mineral spirits, then with MEK. Unpigmented coatings were cured in a few seconds, and pigmented coatings, no thicker than 2.4 mils when containing titanium dioxide, were cured for less than one minute at a distance of ¼ inch from the outside of the lamp housing.
Testing The coatings on the steel panels were subjected to various tests, including a scratch/peeling test consisting of making eleven parallel scratches in one direction and eleven parallel scratches perpendicularly thereto and then attempting to remove squares of coating with applications of tape.

Other tests included an impact test, a hardness test, and a salt fog test for 400–500 hours.

EXAMPLE 1

To 8 g of bisphenol-A epoxy diacrylate 99.5% were admixed 0.8 g of isobornyl acrylate, 0.23 g of trimethylol propane triacrylate, 1 g 2-methyl-1-[4(methylthio)phenyl]-2-(4-morpholinyl)-1-propanone, and 0.25 g isopropyl thioxanthone.

To this mixture, 10% pigment, containing 95% rutile titanium dioxide and 5% manganese ferrite, was admixed. A grit blasted steel panel was washed, just prior to coating application, with 50% mineral spirits/50% methyl ethyl ketone (MEK), then with MEK only. The coating mixture was spread on the metal surface with a brush and was then thinned by drawing a #24 thickness-controlling rod over it, thereby reducing the thickness to 2.4 mils. The panel was placed beneath a RC 500 Xenon lamp and irradiated for one minute. The coating was fully cured, smooth, and hard.

EXAMPLE 2

150.8 g of acrylate oligomer were combined with 120.1 g of IBOA. To 254.8 g of this mixture were admixed 28.3 g TMPTA, 11.32 g of 2-hydroxy-2-methyl-1-phenyl-1-propanone and diphenyl (2,4,6-trimethylbenzoyl) phosphine oxide (1:1), and 3.4 g of ITX.

EXAMPLE 3

150.3 g of polyester tetra-acrylate were combined with 210.9 g of IBOA. To 185.9 g of this mixture were admixed 21.6 g of TMPTA, 8.64 g of 2-hydroxy-2-methyl-1-phenyl-1-propanone and diphenyl (2,4,6-trimethylbenzoyl) phosphine oxide (1:1), and 1.91 g of ITX.

EXAMPLE 4

53.8 g of aromatic urethane diacrylate were combined with 77.6 g of IBOA. To 115.2 g of this mixture were admixed 13.4 g of TMPTA, 5.36 g of 2-hydroxy-2-methyl-1-phenyl-1-propanone and diphenyl (2,4,6-trimethylbenzoyl) phosphine oxide (1:1), and 2.14 g of ITX.

EXAMPLE 5

157.0 g of polyester tetra-acrylate were combined with 51.7 g of IBOA. To 196 g of this mixture were admixed 22.8 g of TMPTA, 9.12 g of 2-hydroxy-2-methyl-1-phenyl-1-propanone and diphenyl (2,4,6-trimethylbenzoyl) phosphine oxide (1:1), and 2.14 g of ITX.

All the preceding formulations were cured successfully with the xenon lamp. These examples demonstrate that a wide variety of other photoinitiators and coating types may be cured effectively with the xenon lamp.

This method of curing is suitable for use in confined spaces because of the extremely low emission of volatile organic compounds. The photosensitizer, such as ITX, is dependent on wavelength; it absorbs energy and transfers it to the photoinitiator. The method produces a well cured coating in a very short time because the xenon lamp emits strongly throughout the visible spectral region and at 390 nm at which a photosensitizer, such as ITX, absorbs. Mercury lamps do not emit strongly at this wavelength. In addition, the RC-500 is a hand held lamp which can be positioned to cure a 3-inch by 3-inch coating area at one time.

Because it will be readily apparent to those skilled in the art of preparing pigmented coatings that innumerable variations, modifications, applications, and extensions of the examples and principles hereinbefore set forth can be made without departing from the spirit and the scope of the invention, what is hereby defined as such scope and is desired to be protected should be measured, and the invention should be limited, only by the following claims.

What is claimed is:

1. A method for applying and curing an organic coating on a metal surface comprising:

A) mixing eight parts of bisphenol-A epoxy diacrylate with 0.8 parts of isobornyl acrylate, 0.23 parts of trimethylol propane triacrylate, one part of 2-methyl-1-[4-(methylthio) phenyl]-2-(4-morpholinyl)-1-propanone and 0.25 parts of isopropyl thioxanthone to form a resin mixture;

B) adding rutile titanium dioxide and manganese ferrite to said resin mixture;

C) applying said mixture to a steel panel to form a thin coating of approximately 2.4 mils thickness thereon;

D) exposing said panel to radiation from a Xenon lamp for approximately one minute to cure said coating.

2. A method for forming a pigmented organic coating on a metal surface comprising:

A. mixing the following components to form a resin mixture
       (1) a resin that is an aromatic urethane diacrylate, an aliphatic urethane diacrylate, a polyester tetra-acrylate, or an epoxy acrylate,
       (2) a photoinitiator that is
          (a) 2-hydroxy-2-methyl-1-phenyl-1-propanone and diphenyl (2,4,6-trimethylbenzoyl) phosphine oxide in a 1:1 molar ratio,
          (b) 2-methyl-1-[4-(methylthio)phenyl]-2-(4-morpholinyl)-1-propanone,
          (c) 2-benzyl-2-(dimethylamino)-1-[4-(4-morpholinyl)phenyl]-1-butanone, or
          (d) N-cyclopropyl-N'-(1,1-dimethylethyl)-6-(methylthio) -1,3,5-triazine-2,4-diamine, and
       (3) a photosensitizer that is
          (a) isopropyl thioxanthone,
          (b) chlorothioxanthone, or
          (c) thioxanthone;

B. mixing a pigment that is titanium dioxide or a mixture of titanium dioxide and manganese ferrite with said resin mixture to form a spreadable composition wherein the pigment comprises from more than zero to 10 weight percent of the spreadable composition;

C. applying said spreadable composition to said metal surface to form a coating thereon; and D. curing said coating with a radiation from a xenon lamp.

3. The method of claim 2 wherein the photosensitizer is isopropyl thioxanthone.

4. The method of claim 2 wherein the photosensitizer is chlorothioxanthone.

5. The method of claim 2 wherein the photosensitizier is thioxanthone.

6. The method of claim 2 wherein the photoinitiator is a 1:1 molar ratio mixture of 2-hydroxy-2-methyl-1-phenyl-1-propanone and diphenyl (2,4,6-trimethylbenzoyl) phosphine oxide.

7. The method of claim 2 wherein the photoinitiator is 2-methyl-1-[4-(methylthio)phenyl]-2-(4-morpholinyl)-1-propanone.

8. The method of claim 2 wherein the photoinitiator is 2-benzyl-2-(dimethylamino)-1-[4-(4-morpholinyl)phenyl]-1-butanone.

9. The method of claim 2 wherein the photoinitiator is N-cyclopropyl-N'-(1,1-dimethylethyl)-6-(methylthio)-1,3,5-triazine-2,4-diamine.

10. The method of claim 2 wherein the pigment used in step B is titanium dioxide.

11. The method of claim 2 wherein the pigment used in step B is a mixture of titanium dioxide and manganese ferrite.

12. The method of claim 2 wherein the resin used in step A is an epoxy acrylate with a diluent that is isobornyl acrylate, trimethylol propane triacrylate, or mixtures thereof added in an amount that reduces the viscosity of the epoxy acrylate resin enough to produce a spreadable composition when mixed with the pigment in step B.

13. The process of claim 2 wherein the resin in step A is an aromatic urethane diacrylate resin.

14. The process of claim 2 wherein the resin in step A is an aliphatic urethane diacrylate resin.

15. The process of claim 2 wherein the resin in step A is a polyester tetra-acrylate resin.

* * * * *